(12) United States Patent
Park et al.

(10) Patent No.: US 9,893,271 B2
(45) Date of Patent: Feb. 13, 2018

(54) SEMICONDUCTOR MEMORY DEVICE

(71) Applicant: SAMSUNG ELECTRONICS CO., LTD., Suwon-si, Gyeonggi-do (KR)

(72) Inventors: Junghwan Park, Seoul (KR); Jonguk Kim, Yongin-si (KR); Soonoh Park, Suwon-si (KR); Jung Moo Lee, Hwaseong-si (KR); Sugwoo Jung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/210,151

(22) Filed: Jul. 14, 2016

(65) Prior Publication Data

US 2017/0110650 A1 Apr. 20, 2017

(30) Foreign Application Priority Data

Oct. 15, 2015 (KR) .................. 10-2015-0144124
Dec. 3, 2015 (KR) .................. 10-2015-0171648

(51) Int. Cl.
*H01L 29/82* (2006.01)
*H01L 43/00* (2006.01)
*H01L 43/02* (2006.01)
*H01L 27/22* (2006.01)
*H01L 43/08* (2006.01)
*H01L 43/12* (2006.01)

(52) U.S. Cl.
CPC ............ *H01L 43/02* (2013.01); *H01L 27/228* (2013.01); *H01L 43/08* (2013.01); *H01L 43/12* (2013.01)

(58) Field of Classification Search
CPC ......... H01L 43/08; H01L 43/12; H01L 43/02; H01L 27/228; H01L 43/10
USPC ........................................................ 257/427
See application file for complete search history.

(56) References Cited

U.S. PATENT DOCUMENTS

| 6,180,542 | B1 | 1/2001 | Hwang |
| 6,791,133 | B2 * | 9/2004 | Farooq .............. H01L 23/49822 257/296 |
| 7,611,912 | B2 | 11/2009 | Hong et al. |
| 8,264,053 | B2 | 9/2012 | Tsukamoto et al. |
| 8,441,083 | B2 | 5/2013 | Tsukamoto et al. |
| 8,673,654 | B2 | 3/2014 | Hong et al. |
| 9,047,968 | B2 | 6/2015 | Keshtbod |
| 2007/0258170 | A1 | 11/2007 | Yuasa |
| 2008/0118993 | A1 | 5/2008 | Park et al. |

(Continued)

FOREIGN PATENT DOCUMENTS

| KR | 2000-0025179 A | 5/2000 |
| KR | 2006-0049265 A | 5/2006 |

(Continued)

*Primary Examiner* — Theresa T Doan
(74) *Attorney, Agent, or Firm* — Lee & Morse P.C.

(57) ABSTRACT

A semiconductor memory device includes a selection transistor on a semiconductor substrate, a lower contact plug connected to a drain region of the selection transistor, and a magnetic tunnel junction pattern on the lower contact plug, the magnetic tunnel junction pattern including a bottom electrode in contact with the lower contact plug, the bottom electrode being an amorphous tantalum nitride layer, a top electrode on the bottom electrode, first and second magnetic layers between the top and bottom electrodes, and a tunnel barrier layer between the first and second magnetic layers.

19 Claims, 10 Drawing Sheets

(56) References Cited

U.S. PATENT DOCUMENTS

| 2012/0193693 | A1 | 8/2012 | Kanaya |
| 2014/0084399 | A1 | 3/2014 | Doczy et al. |
| 2014/0117478 | A1* | 5/2014 | Ikeno ................ G11C 11/161 |
| | | | 257/421 |
| 2015/0035031 | A1 | 2/2015 | Kim |
| 2015/0104883 | A1* | 4/2015 | Kim ................ C23C 14/046 |
| | | | 438/3 |

FOREIGN PATENT DOCUMENTS

| KR | 10-2008-0015271 A | 2/2008 |
| KR | 10-2012-0045408 A | 5/2012 |
| KR | 10-2015-0015601 A | 2/2015 |

\* cited by examiner

SEMICONDUCTOR MEMORY DEVICE

CROSS-REFERENCE TO RELATED APPLICATIONS

Korean Patent Application Nos. 10-2015-0144124, filed on Oct. 15, 2015, and 10-2015-0171648, filed on Dec. 3, 2015, in the Korean Intellectual Property Office, and entitled: "Semiconductor Memory Device," are incorporated by reference herein in its entirety.

BACKGROUND

1. Field

The present disclosure relates to a semiconductor memory device, and in particular, to a highly reliable magnetic memory device with improved electric characteristics.

2. Description of the Related Art

There is an increasing demand for high density, low power consumption, and nonvolatile memory devices, with increasing use of portable computing devices and wireless communication devices. Magnetic memory devices are expected to meet such a demand, and thus, studies on magnetic memory devices have been extensively conducted.

With regard to a data storing mechanism for the magnetic memory device, special attention is paid to a tunnel magneto resistance (TMR) effect of a magnetic tunnel junction (MTJ). For instance, recent studies show that it is possible to realize a MTJ having a TMR ratio ranging from several hundred to several thousand percent, and thus, a magnetic memory device with a MTJ is being extensively studied.

SUMMARY

A semiconductor memory device may include a selection transistor disposed on a semiconductor substrate, a lower contact plug connected to a drain region of the selection transistor, and a magnetic tunnel junction pattern provided on the lower contact plug. The magnetic tunnel junction pattern may include a bottom electrode, a top electrode, first and second magnetic layers between the top and bottom electrodes, and a tunnel barrier layer between the first and second magnetic layers. The bottom electrode may be in contact with the lower contact plug and may be an amorphous tantalum nitride layer.

In some embodiments, the amorphous tantalum nitride layer may have a thickness ranging from about 1 Å to about 10 Å.

In some embodiments, a surface roughness of a top surface of the amorphous tantalum nitride layer may be smaller than a surface roughness of a top surface of the lower contact plug.

In some embodiments, the lower contact plug may include a tungsten layer, and the amorphous tantalum nitride layer may be in contact with the tungsten layer.

In some embodiments, the bottom electrode may be disposed between the lower contact plug and the first magnetic layer, and the first magnetic layer may have a fixed magnetization direction.

In some embodiments, the top electrode may include a crystalline titanium nitride layer and a metal layer.

In some embodiments, a thickness of the bottom electrode may be smaller than a thickness of the top electrode.

In some embodiments, the semiconductor memory device may further include a seed layer interposed between the bottom electrode and the first magnetic layer. The seed layer may be in contact with a top surface of the bottom electrode.

In some embodiments, the seed layer may include ruthenium (Ru) or iridium (Ir).

In some embodiments, the semiconductor memory device may further include a texture blocking layer, which is interposed between the bottom electrode and the seed layer and contains a metallic material.

In some embodiments, the first magnetic layer may be provided adjacent to the bottom electrode and may include a first magnetic pattern, a second magnetic pattern, and an exchange coupling pattern therebetween. The first and second magnetic patterns may have magnetization directions that are fixed to be antiparallel to each other.

According to some embodiments, a semiconductor memory device may include first and second interconnection lines provided on a semiconductor substrate to cross each other, a selection element connected to the first interconnection line, and a magnetic tunnel junction pattern provided between and connected to the selection element and the second interconnection line. The magnetic tunnel junction pattern may include a bottom electrode connected to the selection element, a top electrode connected to the second interconnection line, first and second magnetic layers between the top and bottom electrodes, and a tunnel barrier layer between the first and second magnetic layers. The bottom electrode may be formed of an amorphous tantalum nitride layer, and the top electrode may include a crystalline titanium nitride layer and a metal layer.

In some embodiments, the semiconductor memory device may further include a lower contact plug provided to connect the bottom electrode to the selection element. The bottom electrode may be in direct contact with the lower contact plug, and a surface roughness of a top surface of the bottom electrode may be smaller than a surface roughness of a top surface of the lower contact plug.

In some embodiments, the lower contact plug may include a tungsten layer, and the amorphous tantalum nitride layer may be in contact with the tungsten layer.

In some embodiments, the amorphous tantalum nitride layer may have a thickness ranging from about 1 Å to about 10 Å.

In some embodiments, the semiconductor memory device may further include a seed layer between the bottom electrode and the first magnetic layer. The seed layer may be in direct contact with a top surface of the bottom electrode.

According to some embodiments, a semiconductor memory device may include a selection transistor disposed on a semiconductor substrate, a lower interconnection line electrically connected to the selection transistor, a lower contact plug electrically connected to the lower interconnection line, and a magnetic tunnel junction pattern coupled to the lower contact plug. The magnetic tunnel junction pattern may include a bottom electrode, a top electrode, first and second magnetic layers between the top and bottom electrodes, and a tunnel barrier layer between the first and second magnetic layers. The bottom electrode may be in contact with the lower contact plug and may be formed of an amorphous tantalum nitride layer. A surface roughness of a top surface of the amorphous tantalum nitride layer may be smaller than a surface roughness of a top surface of the lower contact plug.

In some embodiments, the lower interconnection line may include a first metal material, and the lower contact plug may include a second metal material that is different from the first metal material.

In some embodiments, the first metal material may include at least one of copper or copper alloys, and the second metal material may include tungsten.

In some embodiments, the amorphous tantalum nitride layer may have a thickness ranging from about 1 Å to about 10 Å.

According to some embodiments, a semiconductor memory device may include a selection transistor on a semiconductor substrate, a lower contact plug connected to a drain region of the selection transistor, and a magnetic tunnel junction pattern on the lower contact plug, the magnetic tunnel junction pattern including a bottom electrode in contact with the lower contact plug, the bottom electrode being an amorphous layer, a top electrode on the bottom electrode, first and second magnetic layers between the top and bottom electrodes, and a tunnel barrier layer between the first and second magnetic layers.

In some embodiments, the bottom electrode may be an amorphous tantalum nitride layer.

In some embodiments, the bottom electrode may have an amorphous structure in its entirety.

In some embodiments, the first magnetic layer, the tunnel barrier layer, and the second magnetic layer may be stacked in the stated order directly on the bottom electrode.

In some embodiments, a surface of the bottom electrode contacting the first magnetic layer may exhibit a surface roughness of less than about 1 Å.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
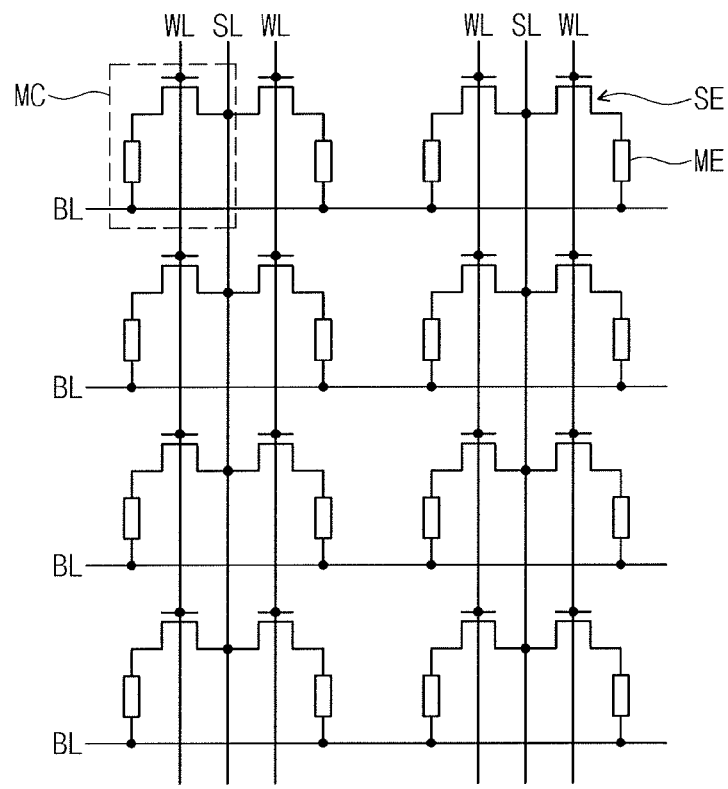
FIG. 1 illustrates a schematic circuit diagram of a cell array of a semiconductor memory device according to some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, the singular terms "a," "an" and "the" are intended to include the plural forms as well, unless the context clearly indicates otherwise.

In the drawing figures, the dimensions of layers and regions may be exaggerated for clarity of illustration. It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. Like reference numerals refer to like elements throughout.

It should further be noted that the figures are intended to illustrate general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Additionally, the embodiments in the detailed description will be described with sectional views as ideal exemplary views. Accordingly, shapes of the exemplary views may be modified according to manufacturing techniques and/or allowable errors. Therefore, the embodiments are not limited to the specific shapes illustrated in the exemplary views, but may include other shapes that may be created according to manufacturing processes.

Exemplary embodiments explained and illustrated herein include their complementary counterparts. The same reference numerals or the same reference designators denote the same elements throughout the specification.

FIG. 1 is a schematic circuit diagram illustrating a cell array of a semiconductor memory device according to some embodiments.

Referring to FIG. 1, a plurality of unit memory cells MC may be arranged two-dimensionally or three-dimensionally. Each of the unit memory cells MC may be provided between a word line WL and a bit line BL crossing each other. Each of the unit memory cells MC may include a memory element ME and a selection element SE. The selection element SE and the memory element ME may be electrically connected in series to each other.

The memory element ME may be connected between the bit line BL and the selection element SE. The selection element SE may be connected between the memory element ME and a source line SL and may be controlled by the word line WL. The memory element ME may be a variable resistance device, whose resistance can be switched to one of at least two values, depending on an electric pulse applied thereto. For example, the memory element ME may be formed to have a layered structure, whose electric resistance can be changed by a spin torque transfer process of an electric current passing therethrough. In some embodiments, the memory element ME may have a layered structure configured to exhibit a magneto-resistance property and may include at least one ferromagnetic material and/or at least one antiferromagnetic material.

The selection element SE may be configured to control a flow of an electric current to be supplied to the memory element ME, in response to a voltage applied to the word line WL. For example, the selection element SE may be one of a diode, a pnp bipolar transistor, an npn bipolar transistor, an NMOS-FET, and a PMOS-FET. In the case where the selection element SE is a three-terminal device (e.g., a bipolar transistor or an MOS FET), the cell array may further include the source line SL, which may be connected to a source electrode of the transistor. In addition, the source line SL may be provided between an adjacent pair of the word lines WL and may be shared in common by a plurality of transistors, which are connected to the word lines WL.

Figure 2:
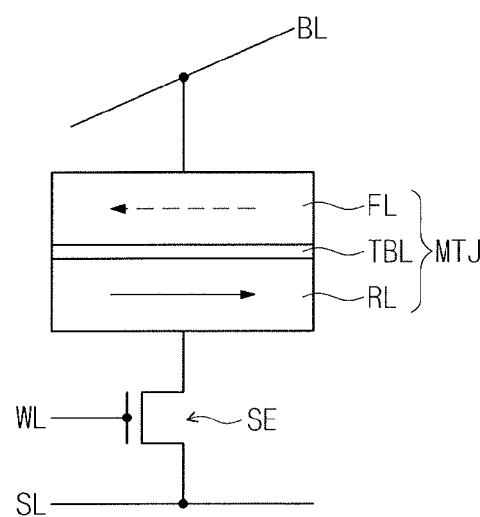
FIG. 2 illustrates a schematic diagram of a unit memory cell of a semiconductor memory device according to some embodiments.

FIG. 2 is a schematic diagram illustrating a unit memory cell of a semiconductor memory device according to some embodiments.

Referring to FIG. 2, each unit memory cell may include the memory element ME and the selection element SE. In some embodiments, the selection element SE may be a MOS FET, and the memory element ME may include a magnetic tunnel junction MTJ. The magnetic tunnel junction MTJ may be provided between the bit line BL and the selection element SE, and the selection element SE may be provided between the magnetic tunnel junction MTJ and the source line SL and may be controlled by the word line WL.

The magnetic tunnel junction MTJ may include a plurality of magnetic layers FL and RL, and a tunnel barrier layer TBL interposed between the magnetic layers FL and RL. One of the magnetic layers may have a fixed magnetization direction, regardless of the presence of an external magnetic field generated under a typical user condition, and thus, it may serve as a reference layer RL of the magnetic tunnel junction MTJ. The other of the magnetic layers may be configured to have a variable magnetization direction, which can be switched by an external magnetic field applied thereto, and thus, it may serve as a free layer FL of the magnetic tunnel junction MTJ.

A difference in magnetization directions between the magnetic layers may lead to a difference in electric resistance of the magnetic tunnel junction MTJ, and this difference may be used as a data storing mechanism of the unit memory cell MC. This means that the electrical resistance of the magnetic tunnel junction MTJ can be controlled by changing the magnetization direction of the free layer FL. For example, the electric resistance of the magnetic tunnel junction MTJ may be much higher when magnetization directions of the reference layer RL and the free layer FL are anti-parallel than when they are parallel.

Figure 3:
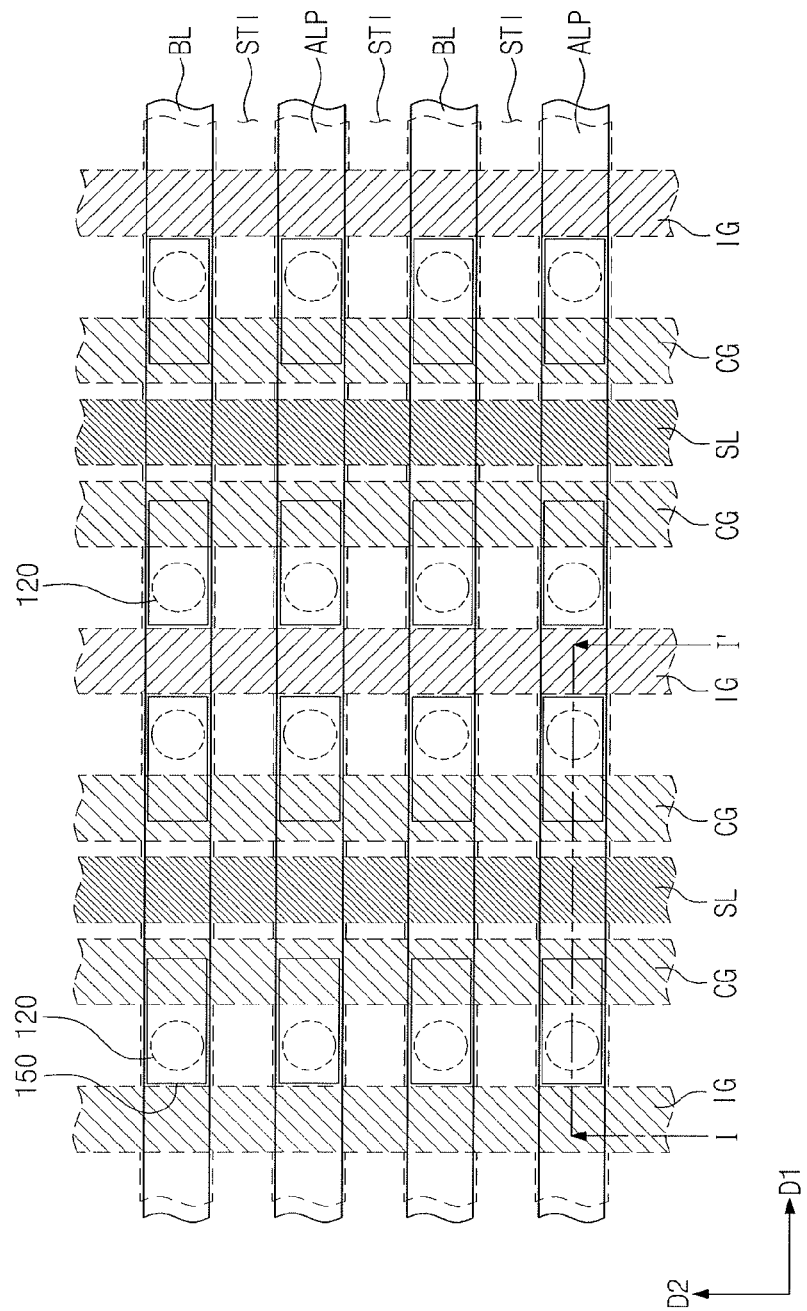
FIG. 3 illustrates a plan view of a semiconductor memory device according to some embodiments.
Figure 4:
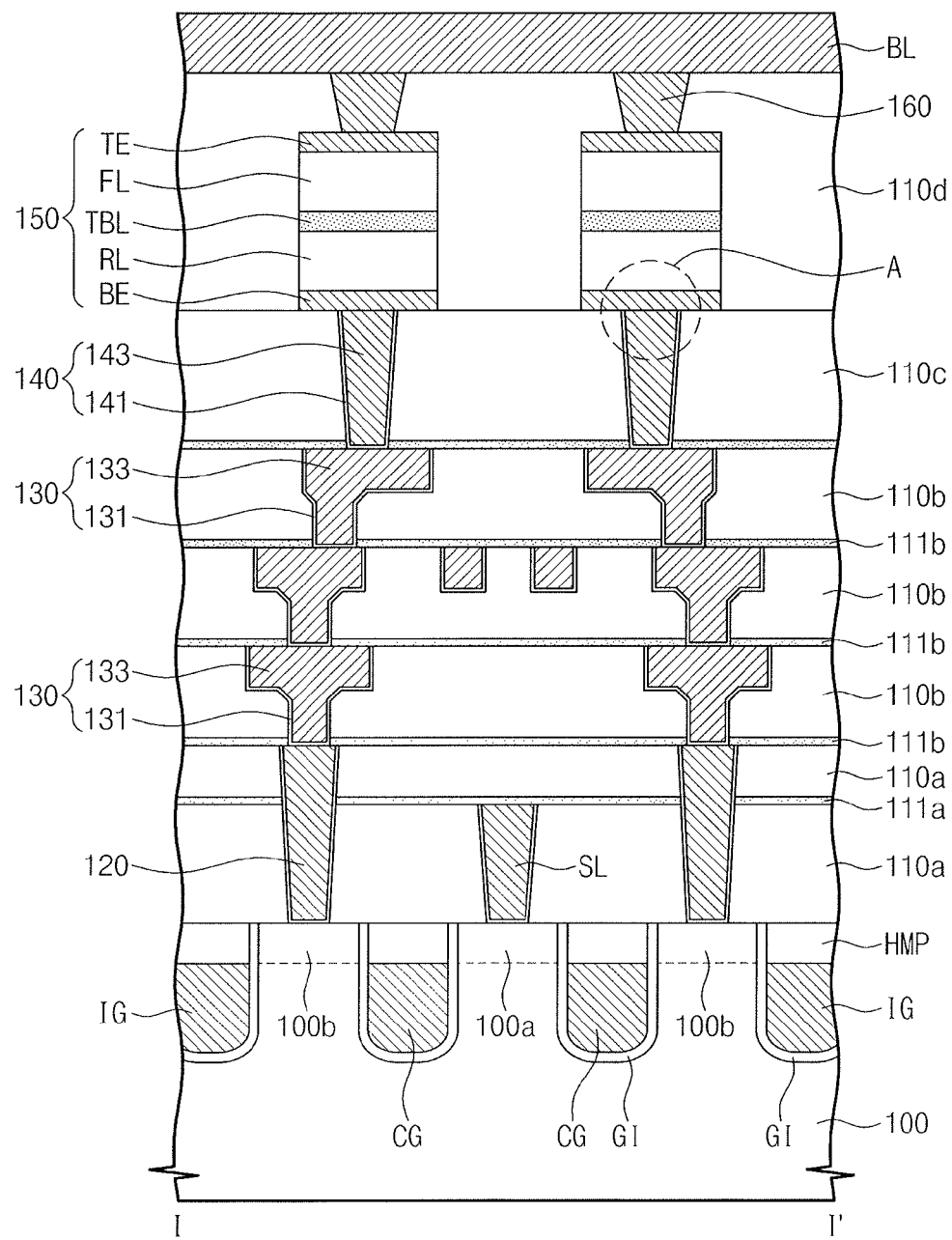
FIG. 4 illustrates a sectional view taken along line I-I' of FIG. 3 to illustrate a semiconductor memory device according to some embodiments.
Figure 5:
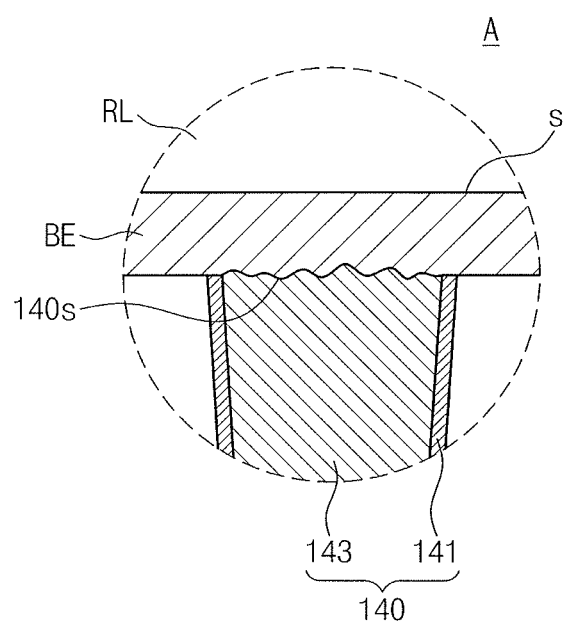
FIG. 5 illustrates an enlarged sectional view of a portion 'A' of FIG. 4.

FIG. 3 is a plan view illustrating a semiconductor memory device according to some embodiments. FIG. 4 is a sectional view taken along line I-I' of FIG. 3. FIG. 5 is an enlarged sectional view of a portion 'A' of FIG. 4.

Referring to FIGS. 3 and 4, device isolation patterns STI may be formed on a semiconductor substrate 100 to define active line patterns ALP. The semiconductor substrate 100 may be, e.g., a silicon substrate, a germanium substrate, or a silicon-germanium substrate. Each of the active line patterns ALP may be defined between a pair of the device isolation patterns STI disposed adjacent to each other. In some embodiments, the active line patterns ALP, each of which is a line-shaped structure extending in a first direction D1, may be spaced apart from each other in a second direction D2 perpendicular to the first direction D1.

Each of the active line patterns ALP may be defined by an adjacent pair of the device isolation patterns STI, and thus, it may extend parallel to the device isolation patterns STI or in the first direction D1. The active line patterns ALP may be doped to have a first conductivity type.

Cell gate electrodes CG and isolation gate electrodes IG may be formed in the semiconductor substrate 100 to cross the active line patterns ALP and the device isolation patterns STI. As illustrated in FIG. 4, the cell gate electrodes CG and the isolation gate electrodes IG may have top surfaces that are positioned at a level lower than a top surface of the semiconductor substrate 100. The cell gate electrode CG and the isolation gate electrode IG may be provided to extend parallel to the second direction D2 or across the active line pattern ALP, and each of them may be a line-shaped structure (FIG. 3).

Referring to FIG. 4, a gate hard mask pattern HMP made of an insulating material may be provided on each of the cell and isolation gate electrodes CG and IG. The gate hard mask patterns HMP may have top surfaces that are substantially coplanar with the top surface of the semiconductor substrate 100. The cell gate electrode CG may be formed of or include at least one of doped semiconductor materials (e.g., doped silicon), metals (e.g., tungsten, aluminum, titanium, and tantalum), conductive metal nitrides (e.g., titanium nitride, tantalum nitride, and tungsten nitride), or metal-semiconductor compounds (e.g., metal silicide). The isolation gate electrode IG may be formed of or include the same material as the cell gate electrode CG. The gate hard mask patterns HMP may be formed of or include at least one of oxides (e.g., silicon oxide), nitrides (e.g., silicon nitride), or oxynitrides (e.g., silicon oxynitride).

A gate insulating layer GI may be provided between the cell gate electrode CG and the semiconductor substrate 100, and between the isolation gate electrode IG and the semiconductor substrate 100. The gate insulating layer GI may include, for example, at least one of oxide (e.g., silicon oxide), nitride (e.g., silicon nitride), oxynitride (e.g., silicon oxynitride), or high-k dielectric materials. Here, the high-k dielectric materials may include at least one of insulating metal oxides (e.g., hafnium oxide, aluminum oxide, and so forth).

When the semiconductor memory device is operated, an isolation voltage may be applied to at least one of the isolation gate electrodes IG. A magnitude of the isolation voltage may be selected to prevent an undesired inversion region from being created in a portion of the semiconductor substrate 100 located below the isolation gate electrode IG. In other words, isolation channel regions, which are located near each isolation gate electrode IG, may be turned off by the isolation voltage. This may make it possible to electrically separate adjacent ones of the memory cells from each other. For example, in the case where the active line pattern ALP is of p-type, the isolation voltage may be a ground voltage or a negative voltage.

First impurity regions 100a may be formed in the active line patterns ALP at a side of each of the cell gate electrodes CG, and second impurity regions 100b may be formed in the active line patterns ALP at another side of each of the cell gate electrodes CG. In some embodiments, each of the first impurity regions 100a may be formed in a portion of a corresponding one of the active line patterns ALP, and between a pair of the cell gate electrodes CG. A pair of the second impurity regions 100b may be formed in two opposite portions of the corresponding one of the active line patterns ALP, which are spaced apart from each other with the pair of the cell gate electrodes CG interposed therebetween. Accordingly, each of the first impurity regions 100a may be shared by a pair of selection transistors. The first and second impurity regions 100a and 100b may be doped to have a second conductivity type that is different from the first conductivity type of the active line patterns ALP. One of the first and second conductivity types may be an n-type, and the other may be a p-type.

In some embodiments, the first and second impurity regions 100a and 100b may serve as source/drain regions of the selection transistors. The first and second impurity regions 100a and 100b, in conjunction with the cell gate electrodes CG provided on the semiconductor substrate 100, may constitute the selection transistors of the semiconductor memory device.

An interlayered insulating layer 110a may be provided on the semiconductor substrate 100. For example, the interlayered insulating layer 110a may include at least one of high density plasma (HDP) oxide, tetraethylorthosilicate (TEOS), plasma-enhanced TEOS (PE-TEOS), O$_3$-TEOS, undoped silicate glass (USG), phosphosilicate glass (PSG), borosilicate glass (BSG), borophosphosilicate glass (BPSG), fluoride silicate glass (FSG), spin on glass (SOG), or tonen silazene (TOSZ). In certain embodiments, the interlayered insulating layer 110a may be formed of or include at least one of silicon nitride, silicon oxynitride, or low-k dielectric materials.

The source lines SL may be provided in the interlayered insulating layer 110a and may extend in the second direction D2 and parallel to each other. When viewed in a plan view, each of the source line SL may be disposed between adjacent ones of the cell gate electrodes CG. The source lines SL may be electrically connected to the first impurity regions 100a, respectively, which are arranged in the second direction D2. The source line SL may have a top surface that is substantially coplanar with that of the interlayered insulating layer 110a. The source line SL may be formed of or include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide).

An etch stop layer 111a may be provided on the interlayered insulating layer 110a. The etch stop layer 111a may be provided to cover top surfaces of the source lines SL. In the case where the source lines SL contain a metallic material, the etch stop layer 111a may prevent metal atoms from being diffused from the source lines SL into the interlayered insulating layer 110a. The etch stop layer 111a may be formed of an insulating material having an etch selectivity with respect to the interlayered insulating layer 110a. For example, the etch stop layer 111a may be formed of or include at least one of oxides (e.g., silicon oxide), nitrides (e.g., silicon nitride), or oxynitrides (e.g., silicon oxynitride).

Buried contact plugs 120 may be provided to penetrate the interlayered insulating layer 110a and the etch stop layer 111a, and in some embodiments, the buried contact plugs 120 may be connected to the second impurity regions 100b, respectively. The buried contact plugs 120 may have top surfaces that are positioned at a higher level than the top surfaces of the source lines SL. The buried contact plugs 120 may be formed of or include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). In certain embodiments, ohmic patterns (not shown) may be respectively provided between the buried contact plugs 120 and the second impurity regions 100b. The ohmic patterns may be formed of or include at least one of metal-semiconductor compounds, such as metal silicide materials (e.g., cobalt silicide or titanium silicide).

Dielectric layers 110b may be provided on the buried contact plugs 120, and diffusion barrier layers 111b may be provided between the dielectric layers 110b. In some embodiments, each of the dielectric layers 110b may be formed of or include at least one of HDP oxide, TEOS, PE-TEOS, USG, BSG, PSG, BPSG, SOG, or TOSZ. In certain embodiments, each of the dielectric layers 110b may include at least one low-k dielectric layer, whose dielectric constant is lower than that of silicon oxide. For example, the dielectric layers 110b may be formed of fluorine-doped oxide (FSG), carbon doped oxide, silicon oxide, hydrogen silsesquioxane (HSQ, SiO:H), methyl silsesquioxane (MSQ, SiO:CH3), or a-SiOC (SiOC:H). The diffusion barrier layers 111b may be formed of or include at least one of silicon nitride (SiN), silicon oxynitride (SiON), silicon carbide (SiC), or silicon carbon nitride layer (SiCN).

Lower interconnection lines 130 may be vertically stacked in the dielectric layers 110b. The lower interconnection lines 130 may be electrically connected to the buried contact plugs 120 or the source lines SL. For example, some of the lower interconnection lines 130 may be electrically connected to the selection transistors that are formed on the semiconductor substrate 100. Others of the lower interconnection lines 130 may be electrically connected to the source lines SL provided on the semiconductor substrate 100. In some embodiments, each of the lower interconnection lines 130 may include a first barrier metal layer 131 and a first metal layer 133, and here, the first metal layer 133 may include a first metal material. For example, the first metal layer 133 may include copper or copper alloys. Here, the copper alloys may be copper compounds containing at least one of C, Ag, Co, Ta, In, Sn, Zn, Mn, Ti, Mg, Cr, Ge, Sr, Pt, Mg, Al, or Zr. The first barrier metal layer 131 may be formed of or include at least one of, for example, Ta, TaN, TaSiN, Ti, TiN, TiSiN, W, or WN.

A lower interlayered insulating layer 110c may be provided on the uppermost one of the lower interconnection lines 130. The lower interlayered insulating layer 110c may include at least one of a silicon oxide layer, a silicon nitride layer, or a silicon oxynitride layer. Alternatively, the lower interlayered insulating layer 110c may include at least one low-k dielectric layer, whose dielectric constant is lower than that of silicon oxide.

A lower contact plug 140 may be provided to pass through the lower interlayered insulating layer 110c. The lower contact plug 140 may be electrically connected to the second impurity region 100b through the lower interconnection lines 130 and the buried contact plugs 120. The lower contact plug 140 may include a second barrier metal layer 141 and a second metal layer 143, and here, the second metal layer 143 may contain a second metal material, which is different from the first metal material of the lower interconnection lines 130. For example, the second metal material may have resistivity greater than the first metal material. For example, the second metal layer 143 may be formed of or include at least one of tungsten, titanium, or tantalum.

In some embodiments, the second metal layer 143 may be a tungsten layer, which may be deposited by one of thermal chemical vapor deposition, plasma enhanced CVD, physical CVD, and atomic layer deposition (ALD) processes. The second barrier metal layer 141 may be formed of or include at least one of Ta, TaN, TaSiN, Ti, TiN, TiSiN, W, or WN.

In some embodiments, the formation of the second metal layer 143 may include a step of growing tungsten grains from a surface of the second barrier metal layer 141, and in this case, a final grain size of the tungsten grains constituting the second metal layer 143 may depend on a process condition in the tungsten growth process. Owing to the presence of the tungsten grains at a top surface of the second metal layer 143, the top surface of the second metal layer 143 may not be uneven as shown in FIG. 5; for example, the top surface of the second metal layer 143 may have surface roughness ranging from about 10 Å to about 20 Å.

A magnetic tunnel junction pattern 150 may be disposed on the lower interlayered insulating layer 110c and may be electrically connected to the lower contact plug 140. The magnetic tunnel junction pattern 150 may include a free magnetic layer FL, a reference magnetic layer RL, and a tunnel barrier layer TBL provided therebetween. Furthermore, the magnetic tunnel junction pattern 150 may include a bottom electrode BE between the lower contact plug 140 and the reference magnetic layer RL, and a top electrode TE between the free magnetic layer FL and an upper contact plug 160.

The reference magnetic layer RL may have a fixed magnetization direction. The free magnetic layer FL may have a magnetization direction that can be switched to be parallel or antiparallel to the fixed magnetization direction of the reference magnetic layer RL by a programming operation. In some embodiments, the magnetization directions of the reference and free magnetic layers RL and FL may be perpendicular to an interface surface between the tunnel barrier layer TBL and the free magnetic layer FL. In other words, at least one of the reference and free magnetic layers RL and FL may include a magnetic material exhibiting a perpendicular magnetic anisotropy. The magnetization direction of the free magnetic layer FL may be changed by a spin torque transfer (STT) programming operation. In other words, the magnetization direction of the free magnetic layer FL may be switched using electrons constituting a program current, based on a spin torque transfer phenomenon.

Referring to FIG. 5, the bottom electrode BE may be in direct contact with a top surface 140s of the lower contact plug 140, and may be formed of an amorphous tantalum nitride layer. In some embodiments, the tantalum nitride layer may have a thickness of about 1 Å to about 100 Å. The tantalum nitride layer may be in a fully amorphous state (i.e., from its bottom surface in contact with the lower contact plug 140 to its top surface). Since the bottom electrode BE is formed of the fully amorphous tantalum nitride layer, it may have, e.g., exhibit, a good surface roughness. In other words, a top surface S of the amorphous tantalum nitride layer, i.e., the top surface S of the bottom electrode BE, may have a surface roughness smaller than that of the top surface 140s of the second metal layer 143. For example, the top surface S of the amorphous tantalum nitride layer may have a surface roughness of about 1 Å or less. The amorphous tantalum nitride layer may suppress increased crystallinity of the reference and free magnetic layers RL and FL formed on the top surface S of the bottom electrode BE, thereby reducing deterioration of the magnetic tunnel junction MTJ.

That is, as described above, since the bottom electrode BE is, e.g., consists essentially of, the amorphous tantalum nitride layer, it is possible to prevent crystallinity of the reference and free magnetic layers RL and FL and the tunnel barrier layer TBL provided on the bottom electrode BE from being affected by a crystal structure of the bottom electrode BE. Therefore, the reliability of the magnetic tunnel junction pattern 150 may be improved.

Referring back to FIG. 4, an upper interlayered insulating layer 110d may be provided on the lower interlayered insulating layer 110c to cover the magnetic tunnel junction pattern 150. The upper contact plug 160 may be provided to pass through the upper interlayered insulating layer 110d and may be connected to the top electrode TE. The upper contact plug 160 may be formed of or include at least one of metals (e.g., tungsten, titanium, and/or tantalum) or conductive metal nitrides (e.g., titanium nitride, tantalum nitride, and/or tungsten nitride).

The bit lines BL may be provided on the upper interlayered insulating layer 110d and may be coupled to the magnetic tunnel junction patterns 150 through the upper contact plugs 160. The upper contact plugs 160 may be coupled to the top electrodes TE of the magnetic tunnel junction patterns 150, respectively. In some embodiments, the bit lines BL may extend in the first direction D1 and may be spaced apart from each other in the second direction D2. The bit lines BL may be formed of or include at least one of for example, metals (e.g., tungsten, titanium, and tantalum) or conductive metal nitrides (e.g., titanium nitride, tantalum nitride, and tungsten nitride).

When the bottom electrode BE is formed of the amorphous tantalum nitride layer, it is possible to reduce the surface roughness of the top surface of the bottom electrode BE. The reduction in the surface roughness of the bottom electrode BE may make it possible to suppress crystallinity of the reference and free magnetic layers RL and FL from being affected by the bottom electrode BE. Accordingly, it is possible to increase a magnetoresistance ratio or a tunnel magnetoresistance ratio of the magnetic tunnel junction pattern and, consequently, to improve electric characteristics of the semiconductor memory device.

Hereinafter, the magnetic tunnel junction pattern 150 according to some embodiments will be described in more detail with reference to FIGS. 6 through 9.

FIGS. 6 through 9 are sectional views illustrating a magnetic tunnel junction pattern of a semiconductor memory device according to some embodiments.

Figure 6:
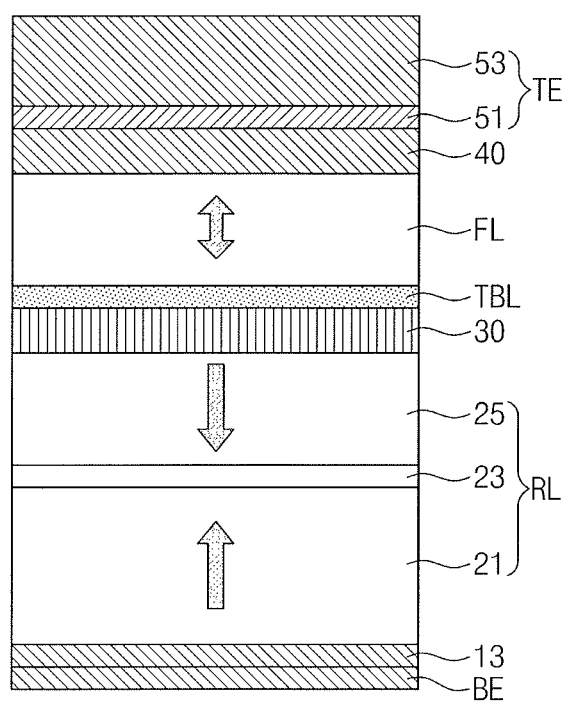
FIGS. 6 through 9 illustrate sectional views of a magnetic tunnel junction pattern of a semiconductor memory device according to some embodiments.

In some embodiments, as shown in FIG. 6, the magnetic tunnel junction pattern 150 may include the bottom electrode BE, the top electrode TE, the reference and free magnetic layers RL and FL between the top and bottom electrodes TE and BE, and the tunnel barrier layer TBL between the reference and free magnetic layers RL and FL. In some embodiments, as described with reference to FIGS. 4 and 5, the bottom electrode BE may be formed of or include an amorphous tantalum nitride layer and may have a thickness of about 1 Å to about 100 Å.

A seed layer 13 may be disposed between the bottom electrode BE and the reference magnetic layer RL. The seed layer 13 may be formed of a conductive material, which may be used as a seed layer in a process of growing the reference magnetic layer RL. The seed layer 13 may have a crystal structure similar to that of a first pinned pattern 21. The seed layer 13 may include a metallic material of low reactivity, and the seed layer 13 may include at least one of metals having a hexagonal close packed (HCP) or face-centered cubic (FCC) structure. For example, the seed layer 13 may be formed of or include at least one of ruthenium (Ru), iridium (Ir), titanium (Ti), platinum (Pt), palladium (Pd), gold (Au), silver (Ag), copper (Cu), or aluminum (Al). The seed layer 13 may be formed to have a thickness ranging from about 2 Å to about 20 Å.

The reference magnetic layer RL may be provided on the seed layer 13. The reference magnetic layer RL may have a fixed magnetization direction, which may be perpendicular to the bottom surface thereof. Alternatively, the reference magnetic layer RL may have a fixed magnetization direction parallel with the bottom surface thereof.

In some embodiments, the reference magnetic layer RL may be configured to have a synthetic anti-ferromagnetic (SAF) structure. For example, the reference magnetic layer RL may include the first pinned pattern 21, a second pinned pattern 25, and an exchange coupling pattern 23 between the first and second pinned patterns 25.

The first pinned pattern 21 may be disposed between the bottom electrode BE and the exchange coupling pattern 23. In other words, the first pinned pattern 21 may be provided adjacent to the bottom electrode BE. The first pinned pattern 21 may include a magnetic material and may have a magnetization direction that is fixed by the second pinned pattern 25. The first pinned pattern 21 may be anti-parallelly coupled to the second pinned pattern 25 by the exchange coupling pattern 23.

In some embodiments, the first pinned pattern 21 may include at least one of CoFeB, CoFeTb with a relative content of Tb of about 10% or more, CoFeGd with a relative content of Gd of about 10% or more, $L1_0$ FePt, $L1_0$ FePd, $L1_0$ CoPd, $L1_0$ CoPt, or hexagonal close packing (HCP) CoPt. In certain embodiments, the first pinned pattern 21 may include a multi-layered structure including alternatingly-stacked magnetic and non-magnetic layers. The multi-layered structure including the alternatingly-stacked magnetic and non-magnetic layers may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where the subscript n denotes the stacking number.

In some embodiments, the first pinned pattern 21 may have a $L1_1$ superlattice structure, and this may make it possible to decrease the saturation magnetization (Ms) of the first pinned pattern 21. For example, the first pinned pattern 21 may include (Co/Pt)n $L1_1$ superlattice, where n is a natural number. Alternatively, the first pinned pattern 21 may include at least one of perpendicular magnetic materials (e.g., CoFeTb, CoFeGd, or CoFeDy), $L1_0$ perpendicular magnetic materials, FCC CoPt, or alloys containing at least one thereof. In the case where the first pinned pattern 21 includes a CoPt alloy, CoPt alloy may be doped with boron (B) to decrease a saturation magnetization of the CoPt alloy.

The second pinned pattern 25 may be provided to be farther from the bottom electrode BE than the first pinned pattern 21. In some embodiments, the second pinned pattern 25 may have a magnetization direction that is opposite to that of the first pinned pattern 21.

In some embodiments, the second pinned pattern 25 may be formed of or include at least one of CoFeB, CoFe, NiFe, CoFePt, CoFePd, CoFeCr, CoFeTb, CoFeGd, or CoFeNi. In the case where the second pinned pattern 25 includes iron and cobalt, a content ratio of iron in the second pinned pattern 25 may be higher than a content ratio of cobalt in the second pinned pattern 25.

The exchange coupling pattern 23 may be configured to allow the first pinned pattern 21 to be magnetically coupled with the second pinned pattern 25 in an anti-parallel manner. For example, the first and second pinned patterns 21 and 25 may be magnetically coupled with each other by the exchange coupling pattern 23 through a Ruderman-Kittel-Kasuya-Yosida (RKKY) interaction. The exchange coupling pattern 23 may be formed of or include at least one of ruthenium (Ru), iridium (Ir), chromium (Cr), or rhodium (Rh).

A polarization enhancement magnetic pattern 30 may be disposed between the reference magnetic layer RL and the tunnel barrier layer TBL. The polarization enhancement magnetic pattern 30 may be in contact with the second pinned pattern 25 and the tunnel barrier layer TBL. The polarization enhancement magnetic pattern 30 may include a magnetic material, which is in contact with the tunnel barrier layer TBL and allows the magnetic tunnel junction pattern to have a high MR ratio. In addition, the polarization enhancement magnetic pattern 30 may include a magnetic material of inducing an interface perpendicular magnetic anisotropy at an interface between the tunnel barrier layer TBL and the polarization enhancement magnetic pattern 30.

The polarization enhancement magnetic pattern 30 may have a crystal structure similar to that of the tunnel barrier layer TBL and may have the same crystal structure as that of the reference magnetic layer RL. Furthermore, the crystal structure of the polarization enhancement magnetic pattern 30 may be different from that of the first pinned pattern 21. For example, the polarization enhancement magnetic pattern 30 may include a body centered cubic (BCC) magnetic material or a BCC magnetic material containing a non-magnetic element.

The polarization enhancement magnetic pattern 30 may be formed of or include a soft magnetic material. The polarization enhancement magnetic pattern 30 may be configured to have a low damping constant and a high spin polarization ratio. In some embodiments, the polarization enhancement magnetic pattern 30 may be formed of or include at least one of cobalt (Co), iron (Fe), or nickel (Ni). The polarization enhancement magnetic pattern 30 may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). As an example, the polarization enhancement magnetic pattern 30 may include a layer of CoFe or NiFe, in which boron (B) is added. For example, the polarization enhancement magnetic pattern 30 may be formed of or include cobalt-iron-boron (CoFeB).

Furthermore, to lower saturation magnetization of the polarization enhancement magnetic pattern 30, the polarization enhancement magnetic pattern 30 may further include at least one of titanium (Ti), aluminum (Al), silicon (Si), magnesium (Mg), tantalum (Ta), or silicon (Si).

The tunnel barrier layer TBL may have a thickness smaller than a spin diffusion distance. The tunnel barrier layer TBL may include an insulating material. The tunnel barrier layer TBL may be in contact with the free magnetic layer FL and may have a crystal structure similar to that of the free magnetic layer FL. In the case where the free magnetic layer FL has a BCC structure, the tunnel barrier layer TBL may include an insulating material having a NaCl crystal structure. In the case where the tunnel barrier layer TBL and the free magnetic layer FL have lattice matched crystal structures at an interface therebetween, the magnetic tunnel junction pattern 150 may have an improved MR ratio (TMR ratio).

The tunnel barrier layer TBL may include at least one of magnesium oxide, titanium oxide, aluminum oxide, magnesium-zinc oxide, or magnesium-boron oxide. As an example, the tunnel barrier layer TBL may be a magnesium oxide (MgO) layer having a NaCl crystal structure. In certain embodiments, the tunnel barrier layer TBL may include a plurality of layers. For example, the tunnel barrier layer TBL may be formed of or include at least one of magnesium, titanium, aluminum, magnesium-zinc oxide, magnesium-boron oxide, titanium nitride, or vanadium nitride.

The free magnetic layer FL may be disposed on the tunnel barrier layer TBL. The free magnetic layer FL may include a magnetic material, which is in contact with the tunnel barrier layer TBL and allows the magnetic tunnel junction pattern to have a high MR ratio.

The free magnetic layer FL may include a magnetic material, whose magnetization direction can be changed.

The free magnetic layer FL may have a magnetization direction, which is parallel or perpendicular to the interface between the tunnel barrier layer TBL and the free magnetic layer FL.

The free magnetic layer FL may include at least one of, for example, perpendicular magnetic materials (e.g., CoFeB, CoFeTb, CoFeGd, CoFeDy, and so forth), $L1_0$ perpendicular magnetic materials, hexagonal close packing (HCP) CoPt, or alloys containing at least one thereof. As an example, the free magnetic layer FL may include cobalt-iron-boron (CoFeB). The free magnetic layer FL may be thinner than the reference magnetic layer RL and may have a coercive force weaker than that of the reference magnetic layer RL.

The free magnetic layer FL may have a crystal structure similar to that of the tunnel barrier layer TBL. For example, in the case where the tunnel barrier layer TBL has a NaCl crystal structure, the free magnetic layer FL may have a BCC structure, whose atoms are arranged in a similar manner to the NaCl crystal structure.

A capping pattern 40 may be disposed on the free magnetic layer FL. The capping pattern 40 may be formed of or include at least one of, for example, tantalum (Ta), ruthenium (Ru), titanium (Ti), or platinum (Pt). In addition, the capping pattern 40 may include a metal oxide material. The metal oxide material may be in contact with the top surface of the free magnetic layer FL, and this may allow the free magnetic layer FL to have an improved perpendicular magnetic anisotropy. For example, the metal oxide material may include magnesium oxide (MgO), tantalum oxide (TaO), and/or aluminum oxide (AlO).

The top electrode TE may be disposed on the capping pattern 40. The top electrode TE may be thicker than the bottom electrode BE and may include a metal-compound pattern and a metal pattern which are sequentially stacked. The metal-compound pattern may include at least one of metal nitrides (e.g., titanium nitride or tantalum nitride) or metal oxides (e.g., tantalum oxide). In some embodiments, the metal-compound pattern may be a crystalline titanium nitride layer of about 5 Å to about 10 Å. The metal pattern may be a tungsten layer. As described with reference to FIG. 4, the metal pattern of the top electrode TE may be in contact with the upper contact plug.

Figure 7:
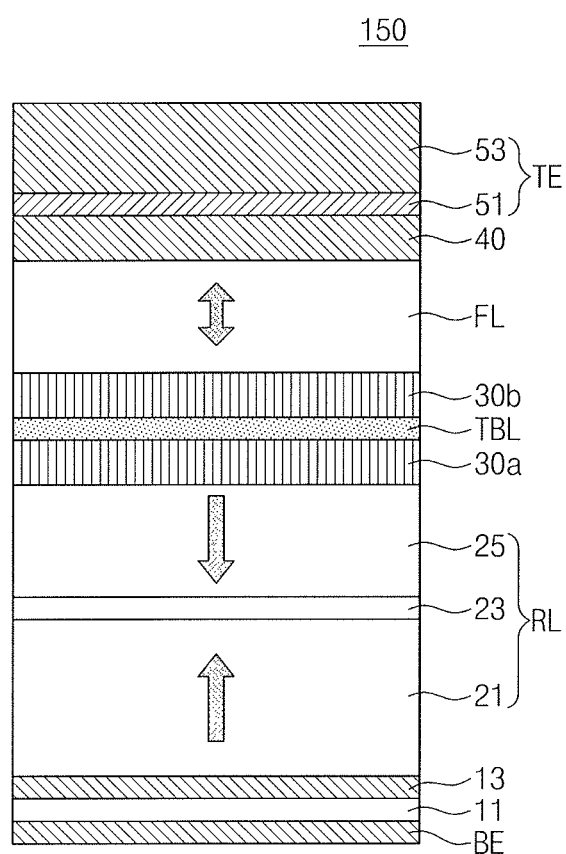

In some embodiments, as shown in FIG. 7, the magnetic tunnel junction pattern 150 may include the reference and free magnetic layers RL and FL between the bottom and top electrodes BE and TE, and the tunnel barrier layer TBL between the reference and free magnetic layers RL and FL, as described with reference to FIG. 6. Here, the reference magnetic layer RL may be a SAF structure including the first pinned pattern 21, the second pinned pattern 25, and the exchange coupling pattern 23 provided therebetween. In addition, the magnetic tunnel junction pattern 150 may include a first polarization enhancement magnetic pattern 30a between the tunnel barrier layer TBL and the reference magnetic layer RL, and a second polarization enhancement magnetic pattern 30b between the tunnel barrier layer TBL and the free magnetic layer FL. The first polarization enhancement magnetic pattern 30a may be in contact with the bottom surface of the tunnel barrier layer TBL, and the second polarization enhancement magnetic pattern 30b may be in contact with the top surface of the tunnel barrier layer. TBL. The first and second polarization enhancement magnetic patterns 30a and 30b may have a crystal structure similar to that of the tunnel barrier layer TBL. For example, the first and second polarization enhancement magnetic patterns 30a and 30b may include a body centered cubic (BCC) magnetic material or a BCC magnetic material containing a non-magnetic element. For example, the first and second polarization enhancement magnetic patterns 30a and 30b may include CoFe or NiFe, in which boron (B) is added. As an example, the first and second polarization enhancement magnetic patterns 30a and 30b may include cobalt-iron-boron (CoFeB).

The magnetic tunnel junction pattern 150 may further include a texture blocking layer 11 provided between the bottom electrode BE and the seed layer 13. The texture blocking layer 11 may include a material that does not have any crystallographic texture or crystallographic orientation. For example, the texture blocking layer 11 may be formed of or include grains whose orientations are random. As an example, the texture blocking layer 11 may include an amorphous metallic material. In some embodiments, the texture blocking layer 11 may be formed of or include tungsten or tantalum. The texture blocking layer 11 may contribute to suppress lattice mismatch between the bottom electrode BE and the seed layer 13.

Figure 8:
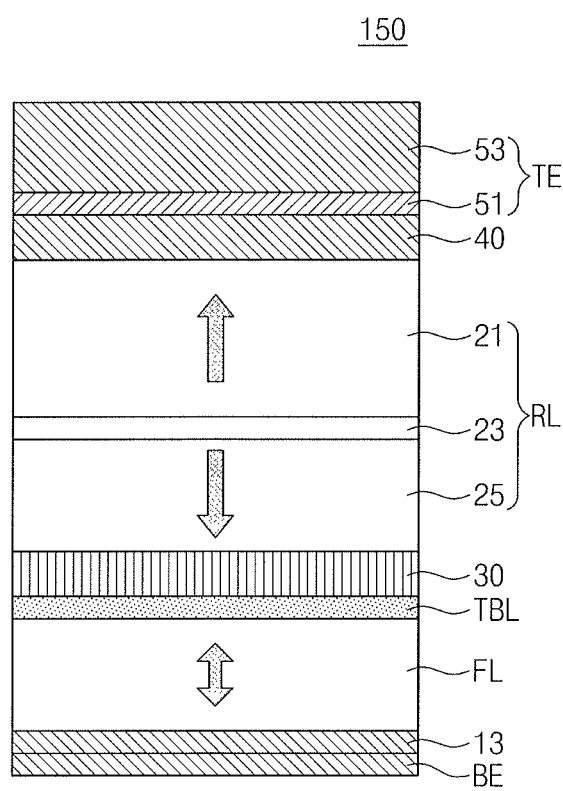

In some embodiments, as shown in FIG. 8, the free magnetic layer FL may be disposed between the bottom electrode BE and the tunnel barrier layer TBL, and the reference magnetic layer RL may be disposed between the top electrode TE and the tunnel barrier layer TBL. In addition, the seed layer 13 may be provided between the bottom electrode BE and the free magnetic layer FL and may be in contact with the free magnetic layer FL.

Figure 9:
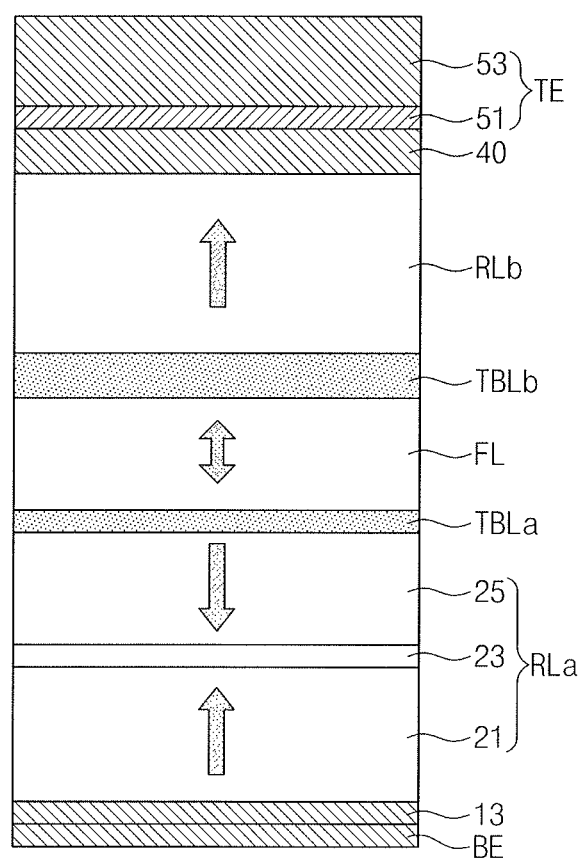

In some embodiments, as shown in FIG. 9, the magnetic tunnel junction pattern 150 may include the first and second reference magnetic layers RLL and RLb, the free magnetic layer FL, and the first and second tunnel barrier layers TBLa and TBLb, which are provided between the bottom electrode BE and the top electrode TE.

The first reference magnetic layer RLa may be disposed between the bottom electrode BE and the first tunnel barrier layer TBLa, and the second reference magnetic layer RL may be disposed between the top electrode TE and the second tunnel barrier layer TBLb. The first reference magnetic layer RLa may have a SAF structure including the first pinned pattern 21, the second pinned pattern 25, and the exchange coupling pattern 23 provided therebetween. The second reference magnetic layer RLb may be formed of a magnetic material, whose magnetization direction is fixed.

The free magnetic layer FL may be disposed between the first and second tunnel barrier layers TBLa and TBLb. Here, the first and second tunnel barrier layers TBLa and TBLb may have different thicknesses.

In some embodiments, the seed layer 13 may be provided between the first reference magnetic layer RLa and the bottom electrode BE formed of the amorphous tantalum nitride layer.

In some embodiments, as shown in FIG. 9, the first reference magnetic layer RLa, the first tunnel barrier layer TBLa, and the free magnetic layer FL may constitute a first magnetic tunnel junction, and the second reference magnetic layer RLb, the second tunnel barrier layer TBLb, and the free magnetic layer FL may constitute a second magnetic tunnel junction.

Figure 10:
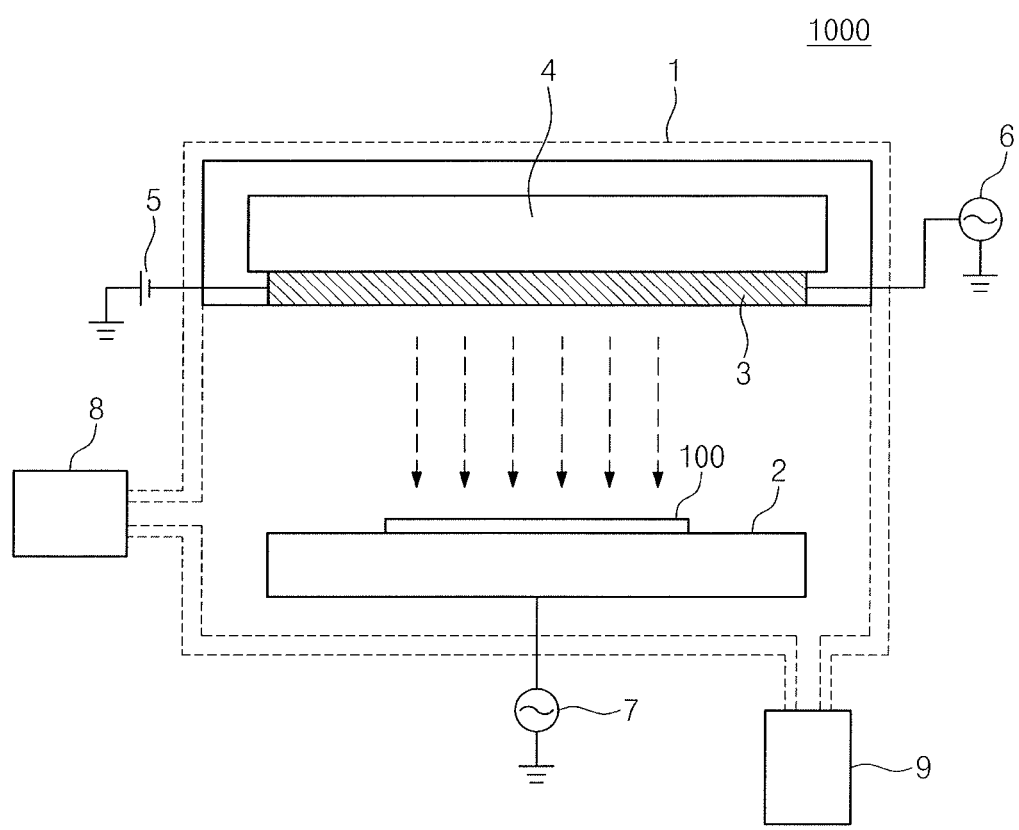
FIG. 10 illustrates a schematic diagram of a thin-film deposition system according to some embodiments.

FIG. 10 is a schematic diagram illustrating a deposition system according to some embodiments. The deposition system of FIG. 10 may be used to fabricate a magnetic memory device according to some embodiments.

Referring to FIG. 10, a thin-film deposition system 1000 may include a chamber 1, a substrate holder 2, a metal target 3, a magnetron 4, power supplying parts 5, 6, 7, a gas supplying unit 8, and an exhausting unit 9.

The substrate holder 2 may be provided in the chamber 1, and the semiconductor substrate 100 may be loaded on the substrate holder 2. The semiconductor substrate 100 may be prepared to have the selection transistors, the lower interconnection lines, and the lower contact plugs, which have been described with reference to FIGS. 3 and 4.

The substrate holder 2 may be used as an electrostatic chuck or a bottom electrode of the chamber 1, and the substrate holder 2 and the metal target 3 may be connected to AC and DC power supplying parts 7 and 5, respectively.

The metal target 3 may be disposed to face the substrate holder 2 and may be formed of a pure metal material. In some embodiments, the metal target 3 may be made of tantalum (Ta). The metal target 3 may be used as a top electrode of the chamber 1, and the first RF power supplying part 6 and the DC power supplying part 5 may be connected to the metal target 3. The magnetron 4 may be provided on the metal target 3 and may include a magnet array.

The chamber 1 may be connected to the gas supplying part 8 through a gas conduit, and during a thin-film deposition process, a process gas may be supplied into the chamber 1 from the gas supplying part 8. For example, the process gas may include nitrogen, ammonia, oxygen, water steam, and/or argon.

The chamber 1 may be connected to the exhausting unit 9 through an exhaust conduit. The exhausting unit 9 may include a vacuum pump or a turbo pump, and may be used to control an internal pressure of the chamber 1 according to a process condition.

Figure 11A:
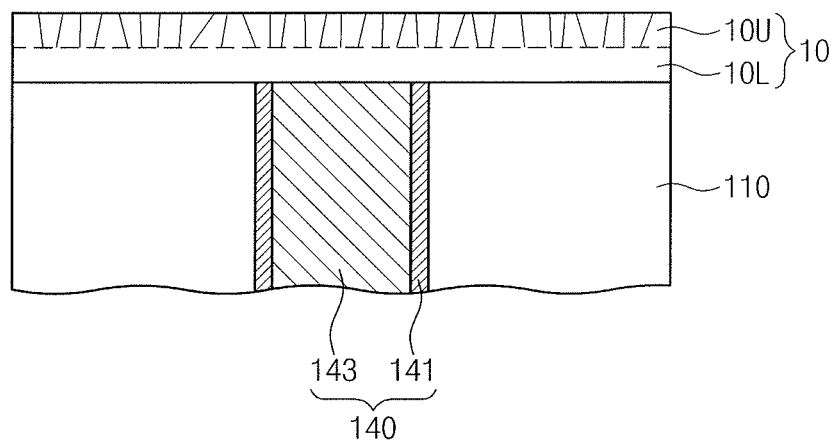
FIGS. 11A and 11B illustrate sectional views of stages in a method of forming a bottom electrode of a semiconductor memory device according to embodiments.
Figure 11B:
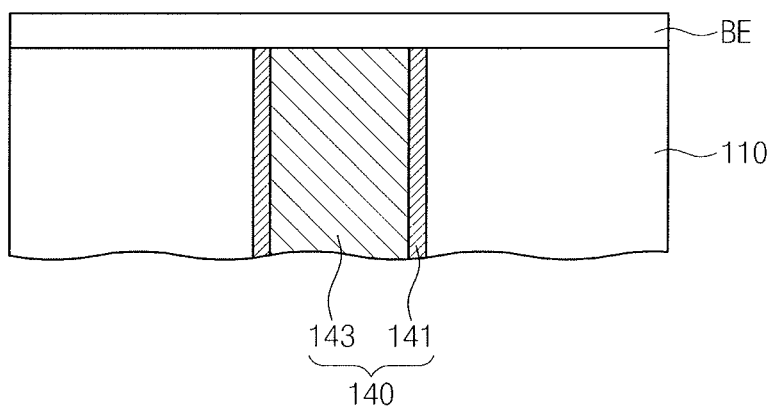

Hereinafter, a method of forming the bottom electrode BE of a semiconductor memory device according to some embodiments will be described with reference to FIGS. 10, 11A, and 11B. FIGS. 11A and 11B are sectional views illustrating stages in a method of forming the bottom electrode BE.

Referring to FIGS. 10 and 11A, the semiconductor substrate 100 may be loaded on the substrate holder 2, and the AC and DC powers may be applied to the metal electrode 3 and the substrate holder 2, respectively. Here, the semiconductor substrate 100 may be prepared to have the selection transistors, the lower interconnection lines, and the lower contact plugs, which have been described with reference to FIGS. 3 and 4. An inert gas (e.g., argon) and a reaction gas (e.g., nitrogen) may be supplied into the chamber 1.

In the chamber 1, the inert gas may be used to generate plasma colliding with the metal target 3, and as a result of the collision, metallic elements may be separated from the metal target 3, and may be reacted with the reaction gas to form a thin layer on a surface of the semiconductor substrate 100. In the case where the metal target 3 made of tantalum is used in the deposition process, tantalum atoms separated from the metal target 3 may react with nitrogen atoms of the reaction gas to form a tantalum nitride layer on the surface of the semiconductor substrate 100. As an example, the tantalum nitride layer may be deposited to cover top surfaces of the lower contact plugs 140. A crystal structure and a surface roughness of the tantalum nitride layer may be controlled by adjusting the process conditions (e.g., AC power, nitrogen flow rate, temperature, and pressure) in the process of depositing the tantalum nitride layer.

In some embodiments, a flow rate of nitrogen may be increased during the process of depositing the tantalum nitride layer on the semiconductor substrate 100, and in this case, the tantalum nitride layer may have an amorphous structure while it has a thickness smaller than a critical thickness. Once the thickness of the tantalum nitride layer exceeds the critical thickness, a newly deposited layer of a tantalum nitride layer with a crystalline structure may be formed on the amorphous tantalum nitride layer. In other words, as illustrated in FIG. 11A, a tantalum nitride layer 10 deposited on the semiconductor substrate 100 may include a lower portion 10L of the tantalum nitride layer with an amorphous structure, and an upper portion 10U of the tantalum nitride layer with a crystalline structure. The semiconductor substrate 100 with the tantalum nitride layer 10 may be unloaded from the chamber 1 and may be transferred to a planarization system.

Referring to FIG. 11B, a planarization process may be performed on the semiconductor substrate 100, on which the tantalum nitride layer is deposited, to remove the crystalline portion (e.g., the upper portion 10U of FIG. 11A) of the tantalum nitride layer. The planarization process may be performed using an anisotropic etching process or a chemical mechanical polishing (CMP) process. Accordingly, the fully amorphous portion of the tantalum nitride layer (i.e., the bottom electrode BE) may remain on the surface of the semiconductor substrate 100. Here, the amorphous tantalum nitride layer (i.e., the bottom electrode BE) may have a thickness ranging from about 10 Å to about 100 Å. The amorphous tantalum nitride layer may have a surface exhibiting surface roughness that is lower than or equal to about 1 Å.

By way of summation and review, according to some embodiments, a thickness of a tantalum nitride layer of a bottom electrode may be reduced, such that the resultant tantalum nitride layer of the bottom electrode has an increased proportion of an amorphous structure, e.g., may be completely amorphous, and improved surface roughness. As such, when the magnetic tunnel junction (MTJ) is formed on the amorphous tantalum nitride layer of the bottom electrode, crystallinity of the magnetic tunnel junction (MTJ), which depends on crystallinity of a layer therebelow, the resultant MTJ may be prevented from being affected by a crystalline structure of the bottom electrode.

That is, according to some embodiments, a semiconductor memory device may include a bottom electrode, which is formed of an amorphous tantalum nitride layer. Thus, it is possible to prevent a magnetic tunnel junction pattern provided on the bottom electrode from being affected by a crystal structure of the bottom electrode. In addition, since the bottom electrode is formed of the amorphous tantalum nitride layer, it is possible to decrease a surface roughness of the bottom electrode. Since the magnetic tunnel junction pattern is formed on the amorphous tantalum nitride layer, it is possible to improve crystallinity of magnetic layers and a tunnel barrier layer, which are formed on the amorphous tantalum nitride layer. This may make it possible to improve electric characteristics (e.g., reliability) of the magnetic tunnel junction pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a selection transistor on a semiconductor substrate;
a lower contact plug connected to a drain region of the selection transistor; and
a magnetic tunnel junction pattern on the lower contact plug, the magnetic tunnel junction pattern including:
a bottom electrode in contact with the lower contact plug, the bottom electrode being an amorphous tantalum nitride layer,
a top electrode on the bottom electrode,
first and second magnetic layers between the top and bottom electrodes, and
a tunnel barrier layer between the first and second magnetic layers,
wherein no magnetic layer is between the bottom electrode and the lower contact plug.

2. The semiconductor memory device as claimed in claim 1, wherein the amorphous tantalum nitride layer has a thickness ranging from about 1 Å to about 10Å.

3. The semiconductor memory device as claimed in claim 1, wherein a surface roughness of a top surface of the amorphous tantalum nitride layer is smaller than a surface roughness of a top surface of the lower contact plug.

4. The semiconductor memory device as claimed in claim 1, wherein the lower contact plug includes a tungsten layer, and the amorphous tantalum nitride layer is in contact with the tungsten layer.

5. The semiconductor memory device as claimed in claim 1, wherein the bottom electrode is between the lower contact plug and the first magnetic layer, and the first magnetic layer has a fixed magnetization direction.

6. The semiconductor memory device as claimed in claim 1, wherein the top electrode includes a crystalline titanium nitride layer and a metal layer.

7. The semiconductor memory device as claimed in claim 1, wherein a thickness of the bottom electrode is smaller than a thickness of the top electrode.

8. The semiconductor memory device as claimed in claim 1, further comprising a seed layer between the bottom electrode and the first magnetic layer, the seed layer being in contact with a top surface of the bottom electrode.

9. The semiconductor memory device as claimed in claim 8, wherein the seed layer includes ruthenium (Ru) or iridium (Ir).

10. The semiconductor memory device as claimed in claim 8, further comprising a texture blocking layer between the bottom electrode and the seed layer, the texture blocking layer including a metallic material.

11. The semiconductor memory device as claimed in claim 1, wherein:
the first magnetic layer is adjacent to the bottom electrode and includes a first magnetic pattern, a second magnetic pattern, and an exchange coupling pattern therebetween, and
the first and second magnetic patterns have magnetization directions that are fixed to be antiparallel to each other.

12. A semiconductor memory device, comprising:
a selection transistor on a semiconductor substrate;
a lower interconnection line electrically connected to the selection transistor;
a lower contact plug electrically connected to the lower interconnection line; and
a magnetic tunnel junction pattern coupled to the lower contact plug, the magnetic tunnel junction pattern including:
a bottom electrode in contact with the lower contact plug, the bottom electrode being an amorphous tantalum nitride layer,
a top electrode on the bottom electrode,
first and second magnetic layers between the top and bottom electrodes, and
a tunnel barrier layer between the first and second magnetic layers,
wherein a surface roughness of a top surface of the amorphous tantalum nitride layer is smaller than a surface roughness of a top surface of the lower contact plug.

13. The semiconductor memory device as claimed in claim 12, wherein the lower interconnection line includes a first metal material, and the lower contact plug includes a second metal material that is different from the first metal material.

14. The semiconductor memory device as claimed in claim 13, wherein the first metal material includes at least one of copper or copper alloys, and the second metal material comprises tungsten.

15. The semiconductor memory device as claimed in claim 12, wherein the amorphous tantalum nitride layer has a thickness ranging from about 1 Å to about 10 Å.

16. A semiconductor memory device, comprising:
a selection transistor on a semiconductor substrate;
a lower contact plug connected to a drain region of the selection transistor; and
a magnetic tunnel junction pattern on the lower contact plug, the magnetic tunnel junction pattern including:
a bottom electrode in contact with the lower contact plug, the bottom electrode being an amorphous layer,
a top electrode on the bottom electrode,
first and second magnetic layers between the top and bottom electrodes, and
a tunnel barrier layer between the first and second magnetic layers,
wherein no magnetic layer is between the bottom electrode and the lower contact plug.

17. The semiconductor memory device as claimed in claim 16, wherein a surface roughness of a top surface of the amorphous layer is smaller than a surface roughness of a top surface of the lower contact plug.

18. The semiconductor memory device as claimed in claim 16, wherein the first magnetic layer, the tunnel barrier layer, and the second magnetic layer are stacked in the stated order directly on the bottom electrode.

19. The semiconductor memory device as claimed in claim 16, wherein a surface of the bottom electrode contacting the first magnetic layer exhibits a surface roughness of less than about 1 Å.

* * * * *